US012652883B2

(12) United States Patent
Tangring et al.

(10) Patent No.: US 12,652,883 B2
(45) Date of Patent: Jun. 9, 2026

(54) METHOD FOR PRODUCING AN OPTOELECTRONIC SEMICONDUCTOR COMPONENT AND OPTOELECTRONIC SEMICONDUCTOR COMPONENT

(71) Applicant: OSRAM Opto Semiconductors GmbH, Regensburg (DE)

(72) Inventors: Ivar Tangring, Regensburg (DE); Gudrun Lindberg, Bad Abbach (DE); Viktor Geringer, Wiesent (DE); Sophia Huppmann, Geldersheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 928 days.

(21) Appl. No.: 17/773,331

(22) PCT Filed: Oct. 26, 2020

(86) PCT No.: PCT/EP2020/080046
§ 371 (c)(1),
(2) Date: Apr. 29, 2022

(87) PCT Pub. No.: WO2021/083838
PCT Pub. Date: May 6, 2021

(65) Prior Publication Data
US 2022/0376133 A1 Nov. 24, 2022

(30) Foreign Application Priority Data
Oct. 30, 2019 (DE) .......................... 102019129327.8

(51) Int. Cl.
*H10H 20/01* (2025.01)
*H10F 71/00* (2025.01)
(Continued)

(52) U.S. Cl.
CPC ............. *H10H 20/01* (2025.01); *H10F 71/00* (2025.01); *H10F 77/413* (2025.01);
(Continued)

(58) Field of Classification Search
CPC .............. H01L 21/67346; H10H 20/01; H10H 20/018; H10H 20/032; H10H 20/0364;
(Continued)

(56) References Cited

U.S. PATENT DOCUMENTS

| | | | |
|---|---|---|---|
| 8,012,856 B2 * | 9/2011 | von Malm | H10H 20/018 438/460 |
| 8,461,601 B2 | 6/2013 | Herrmann | |

(Continued)

FOREIGN PATENT DOCUMENTS

| | | | |
|---|---|---|---|
| CN | 104737307 A | 6/2015 | |
| DE | 102007030129 A1 * | 1/2009 | H01L 33/0079 |

(Continued)

*Primary Examiner* — Telly D Green
(74) *Attorney, Agent, or Firm* — Slater Matsil, LLP

(57) ABSTRACT

In an embodiment a method includes arranging a plurality of semiconductor chips on a carrier, arranging an auxiliary carrier on sides of the semiconductor chips facing away from the carrier, removing the carrier, separating the auxiliary carrier between the semiconductor chips to form auxiliary carrier-chip units, each of the auxiliary carrier-chip units has at least one semiconductor chip and an auxiliary carrier part adjoining the semiconductor chip, arranging each of the auxiliary carrier-chip units on a connecting carrier and removing the auxiliary carrier parts from each auxiliary carrier-chip unit.

20 Claims, 7 Drawing Sheets

(51) Int. Cl.

| | |
|---|---|
| *H10F 77/40* | (2025.01) |
| *H10H 20/851* | (2025.01) |
| *H10H 20/857* | (2025.01) |
| *H10P 72/10* | (2026.01) |

(52) U.S. Cl.
CPC ........ *H10H 20/851* (2025.01); *H10H 20/857* (2025.01); *H10P 72/18* (2026.01)

(58) Field of Classification Search
CPC ............ H10H 20/831; H10H 20/8312; H10H 20/851; H10H 20/8514; H10H 20/857; H10F 71/00; H10F 77/413
See application file for complete search history.

(56) References Cited

U.S. PATENT DOCUMENTS

| | | | |
|---|---|---|---|
| 9,318,357 | B2 | 4/2016 | Brandl et al. |
| 9,780,078 | B2 | 10/2017 | Hoeppel |
| 11,081,620 | B2 | 8/2021 | Plössl et al. |
| 11,127,877 | B2 | 9/2021 | Müller |
| 11,127,890 | B2 | 9/2021 | Ploessl |
| 2011/0136271 | A1 * | 6/2011 | von Malm ........... H10H 20/018 257/E33.056 |
| 2018/0261732 | A1 * | 9/2018 | Richter .............. H10H 20/8506 |
| 2019/0172979 | A1 * | 6/2019 | Richter .................. H10F 77/50 |
| 2020/0056091 | A1 * | 2/2020 | Piquette ............. H10H 20/8512 |
| 2020/0058837 | A1 * | 2/2020 | Gasse .................. H01L 25/167 |
| 2020/0366064 | A1 * | 11/2020 | McLaurin ............. C30B 23/025 |
| 2021/0358792 | A1 * | 11/2021 | Wagner ................ H10H 20/825 |

FOREIGN PATENT DOCUMENTS

| | | | | | |
|---|---|---|---|---|---|
| DE | 102007051168 | A1 * | 4/2009 | ......... | H01L 33/0079 |
| DE | 102009056386 | A1 * | 6/2011 | ......... | H01L 33/0093 |
| DE | 102013111496 | A1 | 4/2015 | | |
| DE | 102015116983 | A1 * | 4/2017 | ......... | H01L 31/0203 |
| DE | 102016124646 | A1 * | 6/2018 | ......... | H01L 33/0008 |
| DE | 102017103164 | A1 * | 8/2018 | ......... | H01L 25/0753 |
| DE | 102018115976 | A1 | 1/2019 | | |
| DE | 102017130131 | A1 | 6/2019 | | |
| DE | 102018111417 | A1 * | 11/2019 | .......... | H01L 25/167 |
| EP | 1588414 | B1 * | 12/2014 | .......... | H01L 21/268 |
| JP | 2015126129 | A * | 7/2015 | ............ | H01L 24/97 |
| JP | 2018515920 | A * | 6/2018 | | |
| WO | WO-2015129689 | A1 * | 9/2015 | ............ | H01L 24/19 |
| WO | WO-2018162583 | A1 * | 9/2018 | | |
| WO | WO-2018202280 | A1 * | 11/2018 | ............ | H01L 21/00 |
| WO | WO-2019042564 | A1 * | 3/2019 | | |
| WO | WO-2020083638 | A1 * | 4/2020 | ............ | H01L 21/52 |
| WO | WO-2020182278 | A1 * | 9/2020 | ......... | H01L 21/6835 |

* cited by examiner

METHOD FOR PRODUCING AN OPTOELECTRONIC SEMICONDUCTOR COMPONENT AND OPTOELECTRONIC SEMICONDUCTOR COMPONENT

This patent application is a national phase filing under section 371 of PCT/EP2020/080046, filed Oct. 26, 2020, which claims the priority of German patent application 102019129327.8, filed Oct. 30, 2019, each of which is incorporated herein by reference in its entirety.

TECHNICAL FIELD

A method for producing an optoelectronic semiconductor component and an optoelectronic semiconductor component are specified. The optoelectronic semiconductor component is designed in particular for the generation and/or detection of electromagnetic radiation, in particular of light that is visible to the human eye.

SUMMARY

Embodiments provide a method for producing an optoelectronic semiconductor component that allows for a simplified production method.

Further embodiments provide an optoelectronic semiconductor component which has improved efficiency.

According to at least one embodiment of the method for producing the optoelectronic semiconductor component, a plurality of semiconductor chips are provided, arranged on a carrier.

In particular, the semiconductor chips comprise a semiconductor body which has at least two different regions of a semiconductor material. The different regions have different types of electrical conductors. The conductor type of the respective semiconductor regions is set by means of doping, for example.

The semiconductor body 2 comprises an active region which is designed to generate and/or to detect electromagnetic radiation. The active region comprises, for example, a pn-junction, a double heterostructure, a single quantum well structure (SQW), or a multiple quantum well structure (MQW) for radiation generation and/or detection. The active region is arranged in particular between the two different regions of the semiconductor body. Each region has a main surface facing away from the active region.

The semiconductor chips have in particular electrical connector structures, which are intended to supply the respective active region with an operating voltage.

The carrier has sufficient thickness to be mechanically self-supporting. The carrier is preferably formed of silicon. In particular, all semiconductor chips are arranged on one side of the carrier, which represents a main surface of the carrier. All semiconductor chips are preferably arranged on the same side of the carrier.

According to at least one embodiment of the method or the previously described embodiment, an auxiliary carrier is arranged on the sides of the semiconductor chips facing away from the carrier. The auxiliary carrier is formed in particular of silicon dioxide and is mechanically self-supporting.

According to at least one embodiment of the method or one of the previously described embodiments, the carrier is removed. In particular, the carrier is completely removed from the semiconductor chips. For example, the carrier is first thinned by means of a polishing process and then completely removed by means of an etching process.

According to at least one embodiment of the method or one of the previously described embodiments, the auxiliary carrier is separated between the semiconductor chips into auxiliary carrier-chip units, each having at least one semiconductor chip and one auxiliary carrier part adjacent thereto. The auxiliary carrier is separated in particular at imaginary seams between two adjacent semiconductor chips. The auxiliary carrier part refers to the part of the auxiliary carrier that is attached to a semiconductor chip after the separation step.

According to at least one embodiment of the method or one of the previously described embodiments, the auxiliary carrier-chip units are arranged on one connector carrier in each case. The connector carrier is provided in particular for mounting the semiconductor component on a printed circuit board, for example.

According to at least one embodiment of the method or one of the previously described embodiments, the respective auxiliary carrier part is removed from the auxiliary carrier-chip units. The auxiliary carrier parts are detached from the semiconductor component by mechanical, chemical, or optical methods, for example.

According to at least one embodiment of the method or one of the embodiments described above, the method comprises the following steps:

A) providing a plurality of semiconductor chips, which are arranged on a carrier, B) arranging an auxiliary carrier on the sides of the semiconductor chips facing away from the carrier, C) removing the carrier, D) separating the auxiliary carrier between the semiconductor chips to form auxiliary carrier-chip units, which each have at least one semiconductor chip and an auxiliary carrier part adjoining said semiconductor chip, E) arranging each of the auxiliary carrier-chip units on a connecting carrier, and F) removing one auxiliary carrier part each from each auxiliary carrier-chip unit.

A method described here for producing an optoelectronic semiconductor component is based, inter alia, on the following considerations: in the production of a conventional optoelectronic semiconductor component, a growth substrate or an additional carrier is often arranged above or below the epitaxially grown semiconductor structure. The arrangement of the carrier and/or the growth substrate advantageously guarantees a sufficient level of mechanical stability of the semiconductor component. A disadvantage is that a substrate or a carrier causes an increased thermal and/or electrical resistance or a deterioration of the optical properties of the semiconductor component.

The method described here for producing an optoelectronic semiconductor component makes use, inter alia, of the idea of producing a semiconductor component without a growth substrate or a carrier. This is accomplished in an intermediate step in which a plurality of semiconductor chips are applied to an auxiliary carrier which guarantees sufficient mechanical stability. In a further method step, the auxiliary carrier is separated and then detached from the semiconductor chips.

This enables the production of "carrier-less" semiconductor chips. "Carrier-less" means here and in the following that the semiconductor chip does not have a carrier body that was used as part of a method for growing the semiconductor body (for example, a growth substrate) and/or as part of a method for producing the semiconductor chip (for example, an intermediate carrier). In particular, there is no growth substrate or any other type of carrier between the semiconductor body and the connector carrier.

For example, a carrier-less semiconductor chip comprises an optical decoupling structure and/or one or more dielectric layers.

According to at least one embodiment of the method or one of the previously described embodiments, the semiconductor chips are each fitted with electrical connector structures before the first step A). The connector structures are designed in particular to supply the active region with an operating voltage. For example, the connector structures are formed of copper.

The respective connector structures for both different regions of semiconductor material with different electrical conductor types are arranged on one of the main surfaces of a semiconductor chip, for example. At least one of the different semiconductor regions is then contacted, for example by means of a via which passes through the active region.

Alternatively, the respective connector structures are arranged on opposite main surfaces of the semiconductor chips. This provides the advantage that no via is necessary.

According to at least one embodiment of the method or one of the previously described embodiments, the semiconductor chips are arranged on the carrier by means of a first contact layer before the first step A). In particular, the first contact layer is structured. For example, the first contact layer is structured in such a way that it has a plurality of segments. In particular, one segment of the structured first contact layer is assigned to each semiconductor chip.

The first contact layer is formed, for example, of gold and tin in a eutectic mixture ratio. In particular, the first contact layer is formed with an adhesive.

The first contact layer is used in particular to mechanically connect the plurality of semiconductor chips to the carrier permanently. The plurality of semiconductor chips are thus advantageously particularly simple to process further. The semiconductor chips are preferably arranged on the carrier in such a way that the side of the semiconductor chips facing away from the carrier is free of electrical connector structures.

According to at least one embodiment of the method or one of the previously described embodiments, the auxiliary carrier is connected to the semiconductor chips by melting a thermoplastic connecting layer thereto. A thermoplastic is a polymer which, when heated up beyond its glass transition temperature, is reversibly transformed into a deformable state. The melting does not necessarily need to involve a complete transition of the thermoplastic material into a liquid state. Rather, it is sufficient to heat up to a point at which the thermoplastic material has sufficient deformability to flow into spaces between adjacent semiconductor chips. The thermoplastic connecting layer preferably fills the spaces between the semiconductor chips. In particular, the connecting layer completely surrounds the semiconductor chips.

According to at least one embodiment of the method or one of the previously described embodiments, step B) is carried out under a vacuum atmosphere. In particular, a vacuum atmosphere allows a particularly good filling of the spaces between adjacent semiconductor chips, avoiding the formation of bubbles. The semiconductor chips are thus advantageously particularly well enclosed by the molding compound of the connecting layer.

According to at least one embodiment of the method or one of the previously described embodiments for producing an optoelectronic semiconductor component, the auxiliary carrier is separated by sawing, or by sawing or scoring and breaking. In the case of a sawing process the cutting depth can preferably be adjusted. For example, the cutting depth is selected in such a way that first of all, only the auxiliary carrier is separated. For example, in a further step of the sawing process, the connecting layer is then separated. Advantageously, with a scoring and breaking process, no cutting waste is produced. For this purpose, for example, sawing or scoring is first used to create a breaking notch at which the material is then broken by means of a subsequent breaking process. In other words, the removal of material due to the finite thickness of a saw blade is advantageously avoided. For example, a scoring process is performed first between adjacent pairs of semiconductor chips, followed by a breaking process for separating the auxiliary carrier.

According to at least one embodiment of the method or one of the previously described embodiments, the auxiliary carrier-chip units are arranged on the connector carrier by means of a second contact layer. In particular, the second contact layer is structured. For example, the second contact layer is structured in such a way that it has a plurality of segments. In particular, one segment of the structured second contact layer is assigned to each semiconductor chip. The second contact layer preferably has a particularly high electrical and thermal conductivity.

The second contact layer is preferably formed of a metal. In particular, the second contact layer is formed by a eutectic alloy of gold and tin. The second contact layer, for example, has a multi-layered laminated structure consisting of different metals and/or metal alloys.

Alternatively, the second contact layer is formed, for example, with a sintered metal connection. The sintered metal connection comprises in particular silver. A sintered metal connection, for example, generates a porous, metallic connection at as low as 150° C. Such low temperatures advantageously reduce the thermal load on the connecting layer and the semiconductor chips.

Before the connection operation, in particular, a flux such as glycol is introduced between the connector carrier and the auxiliary carrier-chip unit. The flux ensures in particular that the auxiliary carrier-chip unit can float on the connector carrier. This simplifies an exact positioning of the auxiliary carrier-chip unit on the connector carrier. The flux is then evaporated away at an elevated temperature, but one which is still below the melting point of the second contact layer. Then, further heating is applied to a temperature above the melting point of the second contact layer for connecting the auxiliary carrier-chip unit to the connector carrier.

According to at least one embodiment of the method or one of the previously described embodiments, the surface tension of the second contact layer is greater than the surface tension of the material of the connecting layer. A higher surface tension of the material of the second contact layer advantageously prevents a possible bending of the electrical connector structures of the semiconductor chip. For example, a connector structure of the semiconductor chip, on the top of which the melting connection material is arranged and on the underside of which the melting material of the second contact layer is arranged, would thus in total only experience a force directed toward the second contact layer. As a result, any undesirable deformation and/or mechanical damage to the connector structure is advantageously prevented.

According to at least one embodiment of the method or one of the previously described embodiments, the arrangement of the auxiliary carrier-chip units on the connector carrier takes place at a temperature between 200° C. and 300° C. Within this temperature range, a complete melting of the material of the second contact layer is advantageously possible, while at the same time avoiding damage to the material of the connecting layer.

According to at least one embodiment of the method or one of the previously described embodiments, the removal of the auxiliary carrier part comprises a laser lift-off, etching, lifting or shearing processing step.

Mechanical methods such as lifting or shearing can be advantageously carried out particularly rapidly, which enables a short cycle time. The disadvantage is an increased mechanical load on the semiconductor chips during the mechanical removal of the auxiliary carrier parts.

For a laser lift-off method, an auxiliary carrier that is transparent to the laser radiation used is advantageous. An etching process is particularly harmless to the surfaces of the semiconductor layer sequence.

According to at least one embodiment of the method or one of the previously described embodiments, residues of the connecting layer are removed by means of a solvent or by means of plasma cleaning. Plasma cleaning is carried out using an oxygen plasma, for example. A particularly clean surface of the semiconductor chip is advantageous for the arrangement of subsequent optical elements on the semiconductor chip.

An optoelectronic semiconductor component is additionally specified. The optoelectronic semiconductor component is produced in particular with the method described here for producing an optoelectronic semiconductor component. This means that all the features disclosed for the optoelectronic semiconductor component are also disclosed for the method and vice versa.

According to at least one embodiment of the optoelectronic semiconductor component, the semiconductor component comprises a connector carrier. The connector carrier is provided in particular for the subsequent mounting of the semiconductor component on a printed circuit board, for example. In particular, the semiconductor chip is supplied with electrical power by means of the connector carrier.

According to at least one embodiment of the optoelectronic semiconductor component or one of the previously described embodiments, the optoelectronic semiconductor component comprises a carrier-less semiconductor chip comprising a first connector structure, a second connector structure, and a semiconductor body comprising a first semiconductor region of a first conductor type, a second semiconductor region of a second conductor type, and an active region located between the first semiconductor region and the second semiconductor region.

The first and second connector structures are designed in particular for supplying the first semiconductor region and the second semiconductor region with an electrical supply voltage. The connector structures are formed of a metal or a metal alloy, for example.

The semiconductor body preferably only comprises a first and a second semiconductor region and an active region arranged between the semiconductor regions. The active region comprises, for example, a pn-junction, a double heterostructure, a single quantum well structure (SQW), or a multiple quantum well structure (MQW) for radiation generation and/or detection.

The semiconductor body preferably comprises a decoupling surface, which is designed for decoupling electromagnetic radiation generated in the active region and/or designed for coupling electromagnetic radiation detected in the active region into the semiconductor body. The decoupling surface is in particular roughened to reduce a waveguide effect in the semiconductor body.

According to at least one embodiment of the optoelectronic semiconductor component or one of the previously described embodiments, the first connector structure is electrically conductively connected to the first semiconductor region.

According to at least one embodiment of the optoelectronic semiconductor component or one of the previously described embodiments, the second connector structure is electrically conductively connected to the second semiconductor region.

According to at least one embodiment of the optoelectronic semiconductor component or one of the previously described embodiments, the semiconductor chip is connected to the connector carrier by means of a second contact layer. The second contact layer is formed, for example, of an alloy of gold and tin. Preferably, the second contact layer is formed by a eutectic alloy.

In particular, between the semiconductor body and the connector carrier only the first and second connector structures are located, which are electrically insulated from each other by means of a dielectric layer, for example, and which provide the electrical connection of the first and second semiconductor region, and a second contact layer for making the mechanical and electrical connection between the semiconductor chip and the connector carrier.

According to at least one embodiment of the optoelectronic semiconductor component or one of the previously described embodiments, at least one of the connector structures is in contact with the connector carrier over the entire cross-sectional area of the semiconductor body, which is parallel to its main extension direction. Contact of the connector structures with the connector carrier over as much of the entire surface as possible enables a particularly low electrical and thermal resistance between the semiconductor body and the connector carrier. Consequently, a particularly good, uniform cooling of the entire cross-sectional area of the semiconductor body is enabled via the connector carrier. In addition, an electrical resistance between the connector carrier and the semiconductor body is reduced in an advantageous manner. A full-surface contact is also provided here and in the following by a connector structure which, due to a manufacturing tolerance, has minor accidental air inclusions. At least 95% of the cross-sectional area of the connector structure is preferably in direct contact with the semiconductor body.

According to at least one embodiment of the optoelectronic semiconductor component or one of the previously described embodiments, an optical element that is transparent to the electromagnetic radiation is arranged behind the semiconductor chip on the side facing away from the connector carrier. The optical element is, for example, a body formed with glass or sapphire, which protects the semiconductor chip from environmental influences. For example, the semiconductor chip is thus protected against moisture and/or the action of oxygen from the atmosphere.

According to at least one embodiment of the optoelectronic semiconductor component or one of the previously described embodiments, the optical element comprises a wavelength conversion material. A wavelength conversion material is designed to convert electromagnetic radiation of a first wavelength to electromagnetic radiation of a second wavelength, the second wavelength being different from the first wavelength. For example, the wavelength conversion material is embedded in a radiolucent matrix as a plurality of particles.

According to at least one embodiment of the optoelectronic semiconductor component or one of the previously described embodiments, the thickness of the semiconductor body is less than 10 μm, preferably less than 5 μm. The thickness of the semiconductor body corresponds to its extension perpendicular to its main extension direction. In particular, the semiconductor body comprises only the epitaxially grown regions and, in particular, no growth substrate. A thin semiconductor body is particularly easy to cool and has a particularly low electrical contact resistance. This means an optoelectronic semiconductor component with a particularly high luminance can be advantageously realized.

According to at least one embodiment of the optoelectronic semiconductor component or one of the previously described embodiments, at least one of the connector structures has a thickness of at least 1 μm. The thickness of the connector structure corresponds to its extension perpendicular to its main extension direction. A thicker connector structure advantageously improves the mechanical stability of the connector structure when it is mounted on the connector carrier.

According to at least one embodiment of the optoelectronic semiconductor component or one of the previously described embodiments, at least one of the connector structures laterally overhangs the semiconductor component. The lateral direction runs in the direction of the main extension direction of the semiconductor body. For example, a bond pad for contacting one of the connector structures is led out on one side of the semiconductor body. This enables a particularly simple electrical contacting.

According to at least one embodiment of the optoelectronic semiconductor component or one of the previously described embodiments, at least one of the connector structures extends over the entire cross-sectional area of the semiconductor body, which is parallel to its main extension direction. A full-surface arrangement of a connector structure enables an advantageous, particularly low thermal and electrical resistance for connecting the optoelectronic semiconductor component to the designated connector carrier.

An optoelectronic semiconductor component described here is particularly suitable for use as a high-power light emitting diode, for example, for use in an automobile headlight.

BRIEF DESCRIPTION OF THE DRAWINGS

Further advantages and advantageous embodiments and refinements of the optoelectronic semiconductor component arise from the following exemplary embodiments in conjunction with those shown in the figures.

In the drawings:

FIGS. 3A to 3D show schematic sectional views of an optoelectronic semiconductor component described here according to a second exemplary embodiment at different stages of a method for its production;

DETAILED DESCRIPTION OF ILLUSTRATIVE EMBODIMENTS

Identical, similar, or equivalently functioning elements are labelled with the same reference signs in the figures. The figures and the relative proportions of the elements represented in the figures are not to be considered to be true to scale. Instead, individual elements may be shown exaggerated in size for ease of visualization and/or better understanding.

Figure 1A:
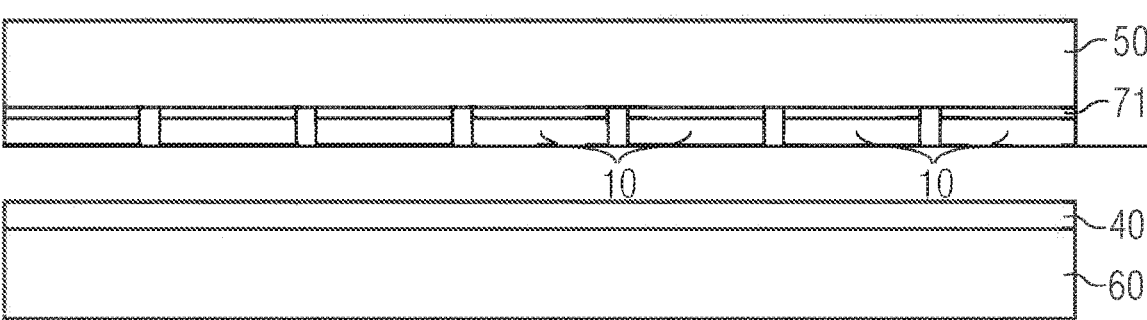
FIGS. 1A to 1K show schematic sectional views of an optoelectronic semiconductor component described here according to a first exemplary embodiment at different stages of a method for its production.

In the step shown in FIG. 1A, a carrier 50 with a plurality of semiconductor chips 10 is provided. The carrier 50 is formed of silicon.

The semiconductor chips 10 are arranged on a common side of the carrier 50. The semiconductor chips 10 are fixed to the carrier 50 by means of a first contact layer 71. An auxiliary carrier 60 and a connecting layer 40 arranged on the auxiliary carrier 60 are also provided. The connecting layer 40 comprises a thermoplastic material, for example a polymer. The auxiliary carrier 60 is formed of glass or sapphire, for example. The auxiliary carrier 60 is preferably transparent to electromagnetic radiation in the visible wavelength range.

Figure 1B:
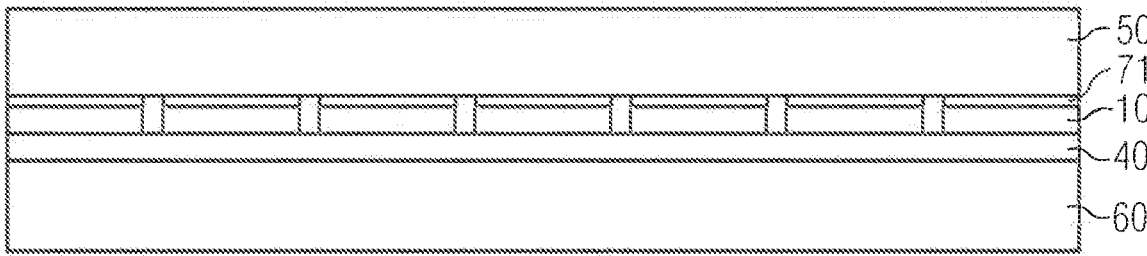

In the step shown in FIG. 1B, the carrier 50 with a plurality of semiconductor chips 10 is arranged on the auxiliary carrier 60 and the connecting layer 40. In a further processing step, the connecting layer 40 is heated to a temperature above its glass transition temperature. This softens the connecting layer 40 and makes it more easily deformable.

Figure 1C:
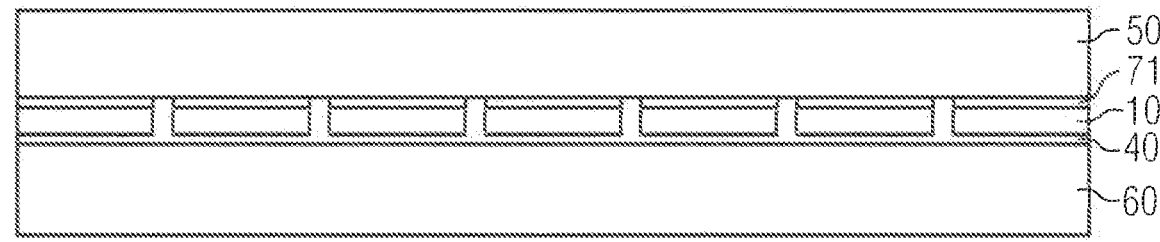

In the step shown in FIG. 1C, the heated connecting layer 40 has penetrated into spaces between the semiconductor chips 10. In particular, the semiconductor chips 10 are completely enclosed by the material of the connecting layer 40.

This step of the method is preferably carried out under a vacuum atmosphere. This advantageously avoids the formation of air bubbles and the emergence of cavities in the connecting layer 40. Consequently, a particularly good coating of the semiconductor chips 10 with the material of the connecting layer 40 is ensured.

Figure 1D:
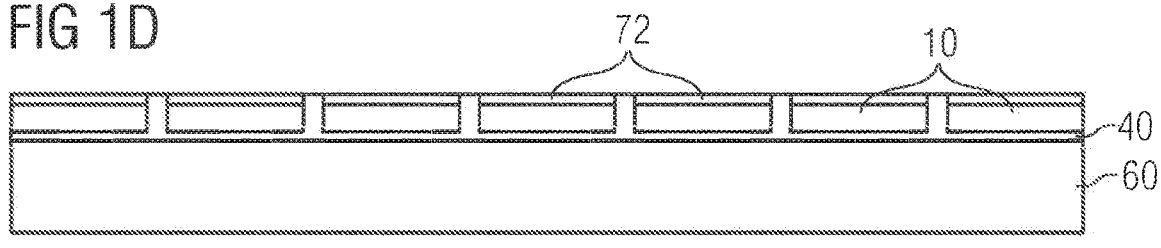

In the step shown in FIG. 1D, the carrier 50 is completely removed from the semiconductor chips 10. For example, the removal of the carrier 50 is carried out by mechanical abrasion, in particular by means of polishing. Residues of the carrier 50 are removed, in particular by means of an etching solution. The first contact layer 71, which was provided for attaching the semiconductor chips 10 to the carrier 50, is also removed. Consequently, a second contact layer 72 is exposed on a side of the semiconductor chips 10 facing away from the auxiliary carrier 60. Alternatively, the second contact layer 72 instead of the first contact layer 71 is applied to the semiconductor chips 10.

Figure 1E:
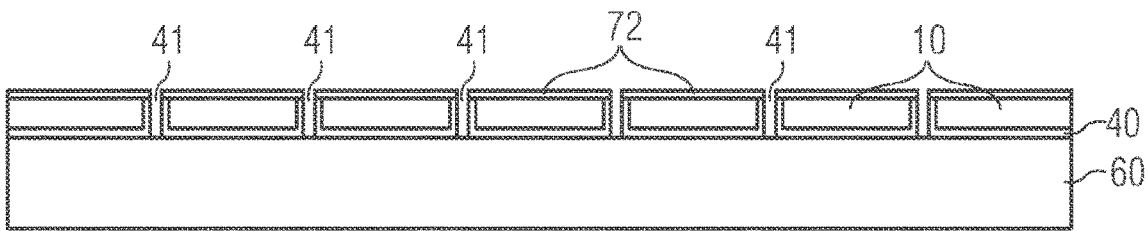

In the step shown in FIG. 1E, recesses 41 are created in the connecting layer 40. The recesses 41 are arranged between pairs of adjacent semiconductor chips 10 and extend from a side of the connecting layer 40 facing away from the auxiliary carrier 60 through the entire connecting layer 40 as far as the auxiliary carrier 60. For example, the recesses 41 are created by means of a sawing process. For example, the recesses 41 represent breaking notches for a subsequent separation step, provided that they extend at least partially into the auxiliary carrier 60.

Figure 1F:
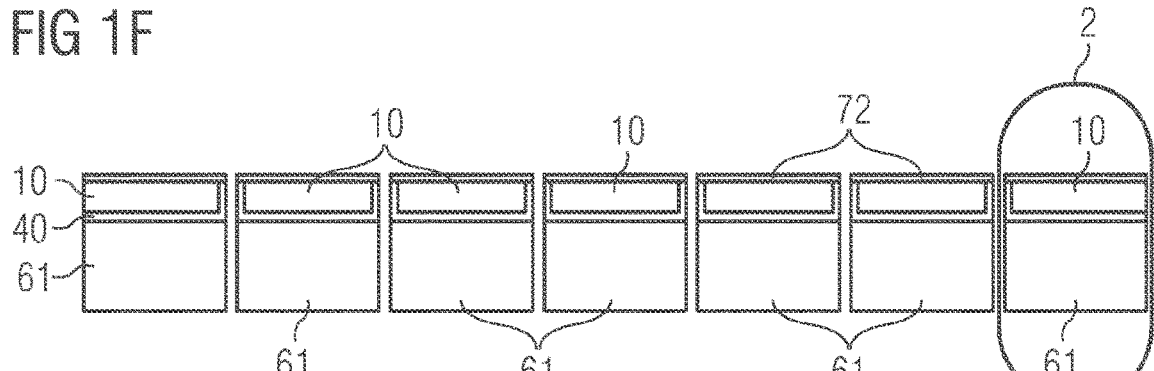

At the stage shown in FIG. 1F, the auxiliary carrier 60 is separated into a plurality of auxiliary carrier-chip units 2. Each auxiliary carrier-chip unit 2 comprises a semiconductor chip 10 and an auxiliary carrier part 61. The separation of the auxiliary carrier 60 into the auxiliary carrier parts 61 is carried out by breaking it at the break points defined by the recesses 41 or by sawing.

Figure 1G:
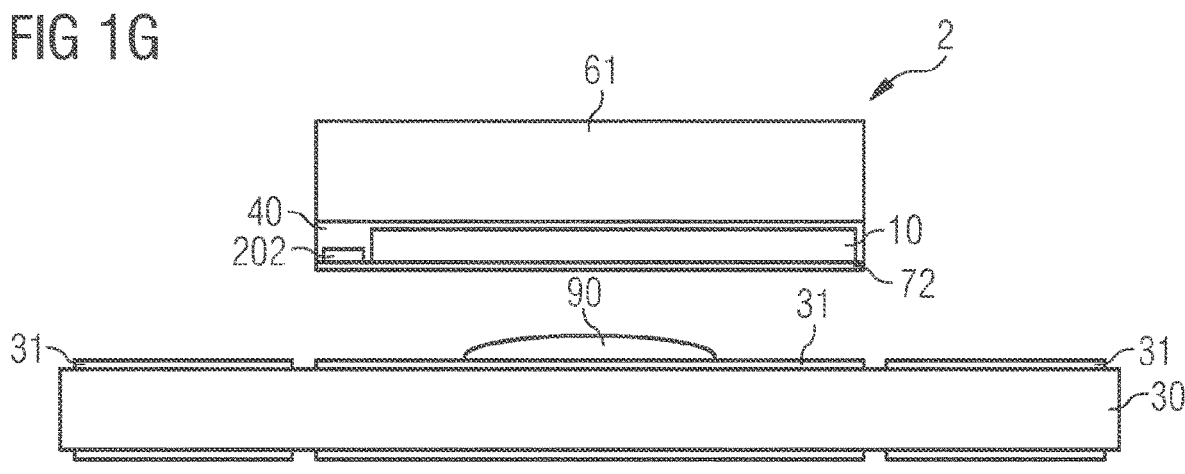

In the step shown in FIG. 1G, the auxiliary carrier-chip unit 2 is arranged on a connector carrier 30 by means of the second contact layer 72. The second contact layer 72 comprises in particular a eutectic alloy of gold and tin. The semiconductor chip 10 also comprises a first connector structure 201 and a second connector structure 202. The first connector structure 201 is arranged between the second contact layer 72 and the semiconductor layers and is not shown in this figure. The second connector structure 202 is arranged at the side and embedded in the connecting layer 40.

The connector carrier 30 is formed of aluminum nitride. In addition, the connector carrier 30 comprises contact structures 31 for electrical contacting. The contact structures 31 are formed of copper. To facilitate positioning of the auxiliary carrier-chip unit 2 on the connector carrier 30, a flux 90 is applied to the connector carrier 30. The flux 90 comprises glycol, for example.

Figure 1H:
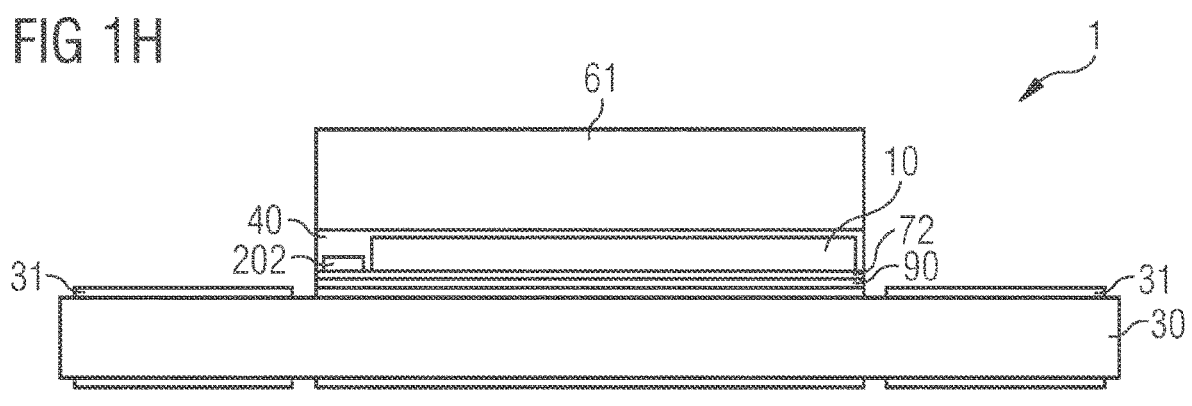

In the step shown in FIG. 1H, the auxiliary carrier-chip unit 2 is aligned on the connector carrier 30 before the auxiliary carrier-chip units (2) are arranged on the connector carrier (30). The flux 90 allows the auxiliary carrier-chip unit 2 to float on the connector carrier 30. In other words, the auxiliary carrier-chip unit 2 is free to move on the connector carrier 30 as long as the flux 90 remains present between the auxiliary carrier-chip unit 2 and the connector carrier 30. In a further processing step, the flux 90 is evaporated off at a temperature below the melting temperature of the second contact layer 72.

Figure 1I:
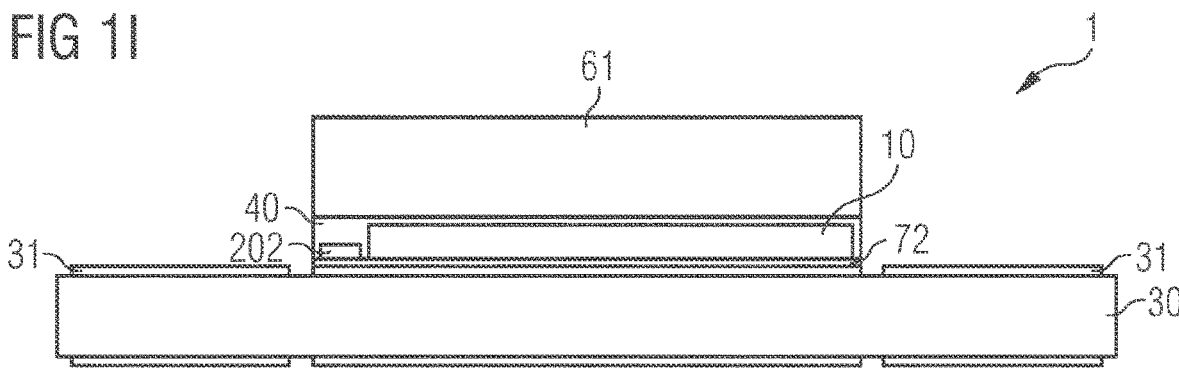

At the stage shown in FIG. 1I, the flux 90 has completely evaporated and by increasing the temperature to over 280° C., the material of the second contact layer 72 has melted. The connector carrier 30 is now connected to the auxiliary carrier-chip unit 2 to form an optoelectronic semiconductor component 1. The surface tension of the material of the second contact layer 72 is greater than the surface tension of the material of the connecting layer 40. The net result is that a force which is directed toward the connector carrier 30 acts on the second connector structure 202. This advantageously prevents the second connector structure 202 from bending in the direction of the connecting layer 40.

Figure 1J:
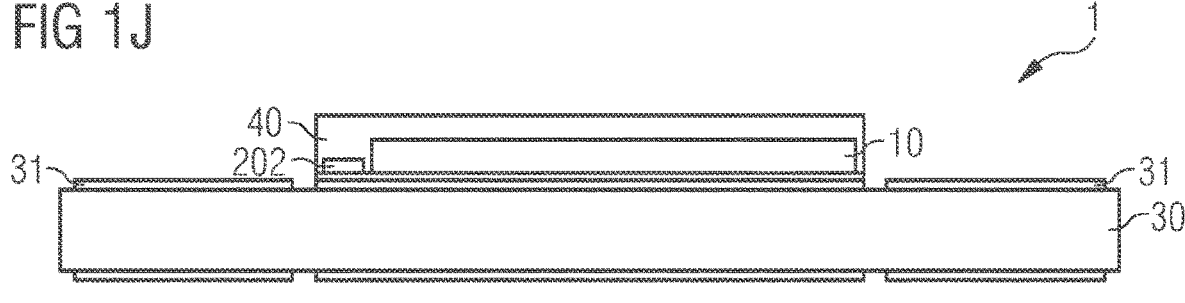

In the step shown in FIG. 1J, the auxiliary carrier part 61 is completely removed from the optoelectronic semiconductor component 1. For example, the auxiliary carrier part 61 is mechanically removed by shearing the auxiliary carrier part 61 from the connecting layer 40. The connecting layer 40 initially remains on the semiconductor chip 10.

Figure 1K:
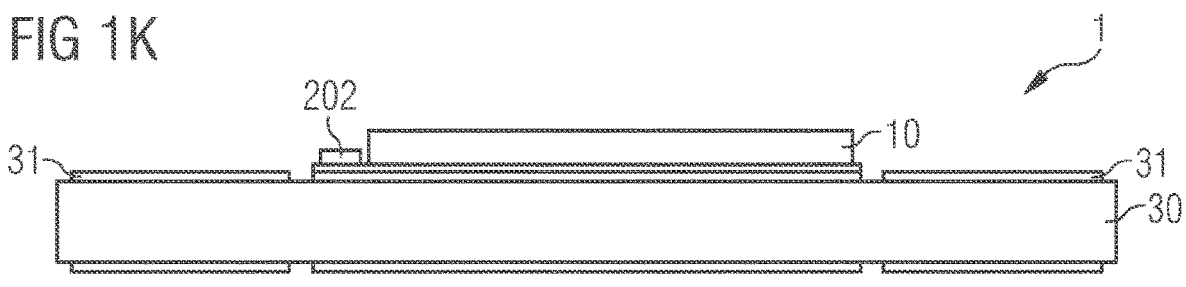

At the stage shown in FIG. 1K, the connecting layer 40 has been completely removed from the semiconductor chip 10. For example, the connecting layer 40 is completely dissolved by means of a solvent. The surface of the semiconductor chip 10 facing the connector carrier 30 is completely freed of residues of the connecting layer 40 by means of a cleaning process, for example a plasma etching process. This advantageously enables a particularly simple rearrangement of optical elements on the semiconductor chip 10.

Figure 2A:
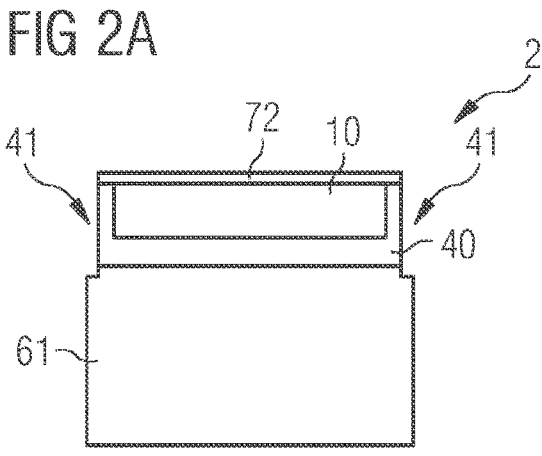
FIG. 2A shows a schematic sectional view of an auxiliary carrier-chip unit described here according to a first exemplary embodiment.

In the exemplary embodiment of an auxiliary carrier-chip unit 2 described here, shown in FIG. 2A in a schematic sectional view, the connecting layer 40 around the semiconductor chip 10 has recesses 41. The recesses 41 are generated by a sawing process or by laser ablation, for example. The recesses reach at least into the auxiliary carrier 60 and extend partially into the auxiliary carrier 60. The auxiliary carrier 60 is thus provided with a mechanical weak point, which is used, for example, in a breaking process for separating the auxiliary carrier 60 into the auxiliary carrier parts 61.

Figure 2B:
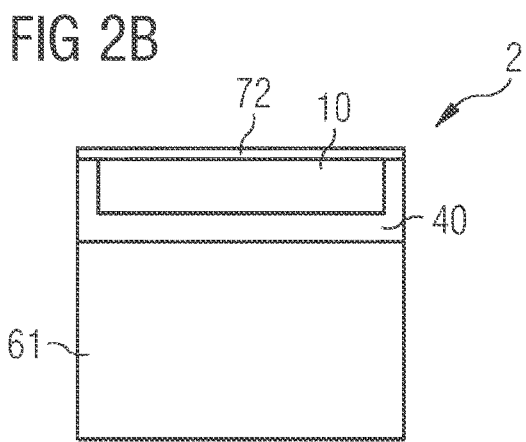
FIG. 2B shows a schematic sectional view of an auxiliary carrier-chip unit described here according to a second exemplary embodiment.

In the exemplary embodiment of an auxiliary carrier-chip unit 2 described here, shown in FIG. 2B in a schematic sectional view, the auxiliary carrier-chip unit 2 shown does not have any recesses 41. For example, this auxiliary carrier-chip unit 2 was severed by means of a single processing step in a sawing process. The saw completely severed the auxiliary carrier 60 and the connecting layer 40 in one step.

Figure 2C:
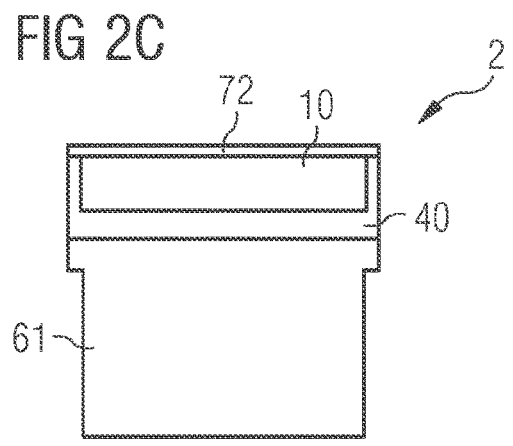
FIG. 2C shows a schematic sectional view of an auxiliary carrier-chip unit described here according to a third exemplary embodiment.

In the exemplary embodiment of an auxiliary carrier-chip unit 2 described here, shown in FIG. 2C in a schematic sectional view, a first sawing process is carried out from the side of the auxiliary carrier-chip unit 2 facing the auxiliary carrier 60 and a second sawing process is carried out from the side of the auxiliary carrier chip unit 2 opposite the auxiliary carrier 60 to separate the auxiliary carrier 60 into auxiliary carrier parts 61. A cutting width of the sawing processes is advantageously variable. Thus, in the first sawing process a wider cut is tolerated than in the second sawing process.

Figures 3A, 3B, 3C, 3D:
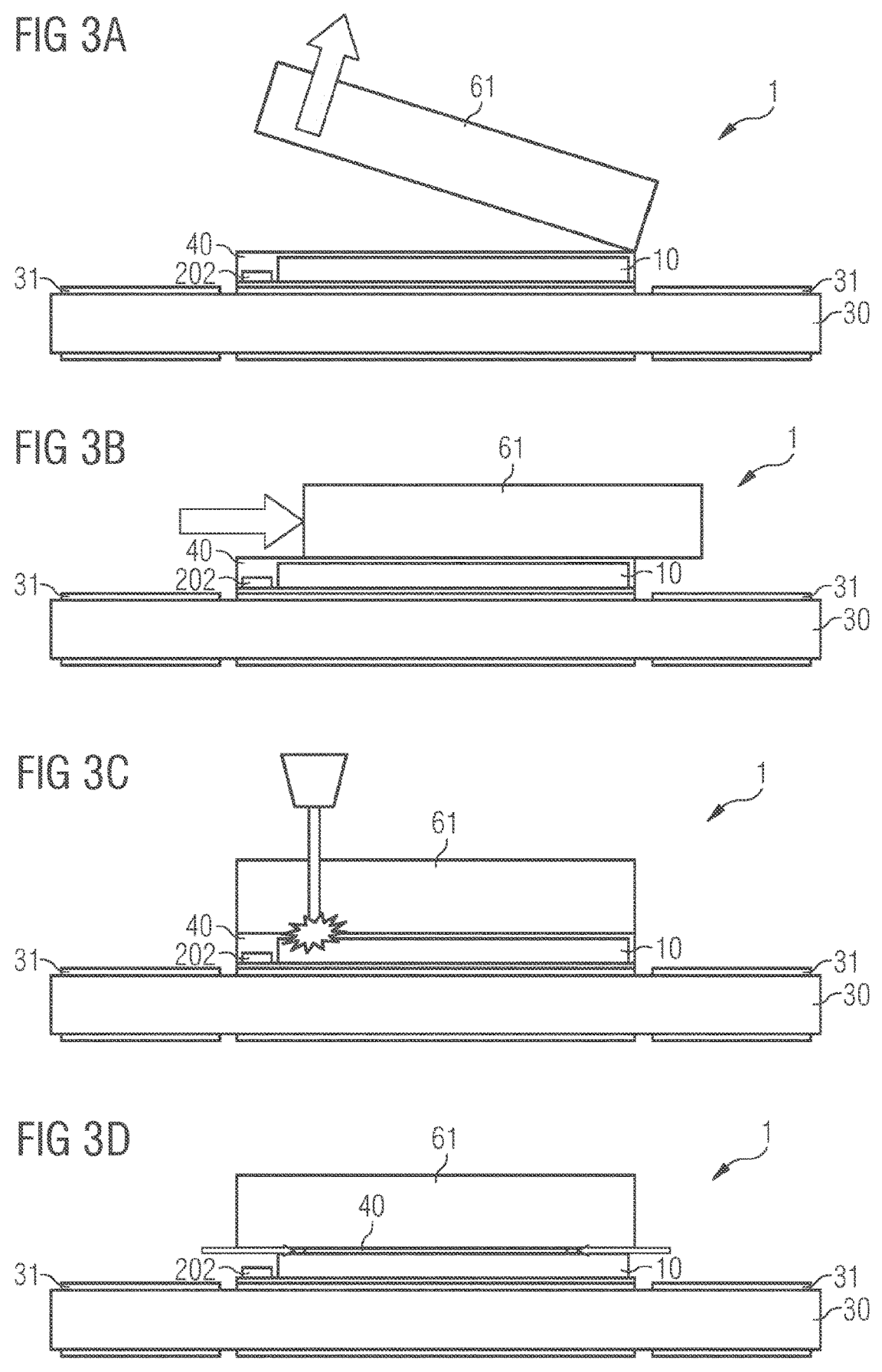

In the step shown in FIG. 3A, the auxiliary carrier part 61 is removed by mechanical lifting. The direction in which a force is exerted on the auxiliary carrier part 61 is indicated with an arrow. The connecting layer 40 is initially heated to a temperature above its glass transition temperature in order to reduce the adhesion between the auxiliary carrier part 61 and the connecting layer 40. The removal of the auxiliary carrier part 61 is therefore particularly fast and cost-effective. A disadvantage is that, depending on the temperature, the semiconductor chip 10 is exposed to a high mechanical load.

In the step shown in FIG. 3B, the auxiliary carrier part 61 is removed by mechanical shearing. In the shearing process, the auxiliary carrier part 61 is removed by applying a force to a side surface of the auxiliary carrier part 61. The direction in which a force is exerted on the auxiliary carrier part 61 is indicated with an arrow. Before applying the force, the connecting layer 40 is preferably heated to a temperature above its glass transition temperature in order to reduce the adhesion between the auxiliary carrier part 61 and the connecting layer 40. The majority of the connecting layer 40 remains on the semiconductor chip 10.

In the step shown in FIG. 3C, the auxiliary carrier part 61 is removed by means of laser lift-off. In the laser lift-off process, the adhesion between the connecting layer 40 and the auxiliary carrier part 61 is reduced or eliminated by means of a laser radiation. For example, at least a part of the connecting layer 40 is melted or vaporized by means of the laser radiation. The laser beam penetrates through the radiolucent auxiliary carrier part 61 as far as the connecting layer 40. In other words, the auxiliary carrier part 61 is preferably designed to be radiolucent for the laser radiation.

In the step shown in FIG. 3D, the auxiliary carrier part 61 is removed by means of a solvent. The connecting layer 40 is completely dissolved by means of a chemical solvent. The solvent penetrates from the side surfaces of the connecting layer 40 to the center of the semiconductor chip 10. Depending on the lateral extension of the semiconductor chip 10, a greater amount of time is thus required to remove the connecting layer 40. The removal of the connecting layer 40 and the auxiliary carrier part 61 is thus particularly harmless to the semiconductor chip 10. A further processing step to remove the connecting layer 40 can therefore be significantly shortened or is advantageously eliminated entirely.

Figure 4:
FIG. 4 shows a schematic sectional view of an optoelectronic semiconductor component described here according to a third exemplary embodiment.

In the exemplary embodiment shown in FIG. 4 in a sectional view, the optoelectronic semiconductor component 1 comprises a semiconductor chip 10 arranged on a connector carrier 30, and a protective diode 101 arranged to the side of it. The protective diode 101 is also arranged on the connector carrier 30 and fulfills the function of an ESD protective diode. The protective diode 101 thus protects the semiconductor chip 10 from damage due to electrostatic discharge.

Figure 5:
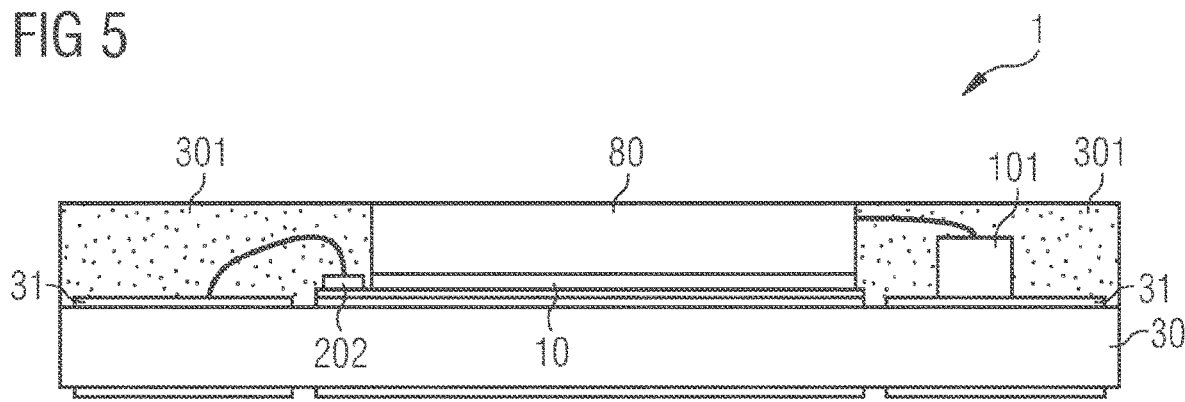
FIG. 5 shows a schematic sectional view of an optoelectronic semiconductor component described here according to a fourth exemplary embodiment.

In the exemplary embodiment shown in FIG. 5 in a sectional view, an optical element 80 is arranged on the semiconductor chip 1. The exemplary embodiment shown here essentially corresponds to the third exemplary embodiment of an optoelectronic semiconductor component 1, shown in FIG. 4. The optical element 80 is arranged on a side of the semiconductor chip 10 facing away from the connector carrier 30. The optical element 80 is radiolucent and contains, for example, a wavelength conversion material.

In addition, the semiconductor chip 10 and the optical element 80 are surrounded by a molded body 301. The molded body 301 is flush with the side of the optical element 80 facing away from the connector carrier 30. For example, the molded body 301 is formed from a polymer that has a white filling material. For example, the molded body 301 is formed from a silicone into which particles of titanium dioxide have been introduced. Electromagnetic radiation emitted from the side of the semiconductor chip 10 or the optical protective element 80 is at least partially reflected back by the molded body 301. The molded body 301 also provides protection for the semiconductor chip 10 against mechanical influences and/or chemical influences from the surrounding atmosphere.

Figure 6:
FIG. 6 shows a schematic sectional view of an optoelectronic semiconductor component described here according to a fifth exemplary embodiment.

In the exemplary embodiment of an optoelectronic semiconductor component 1 shown in a sectional view in FIG. 6, a second connector structure 202 is arranged on a side of a semiconductor chip 10 facing away from a connector carrier 30. In this more mechanically stable design of the second connector structure 202, the surface tension of the material of the second contact layer 72 is largely irrelevant compared to the surface tension of the material of the connecting layer 40.

Figure 7:
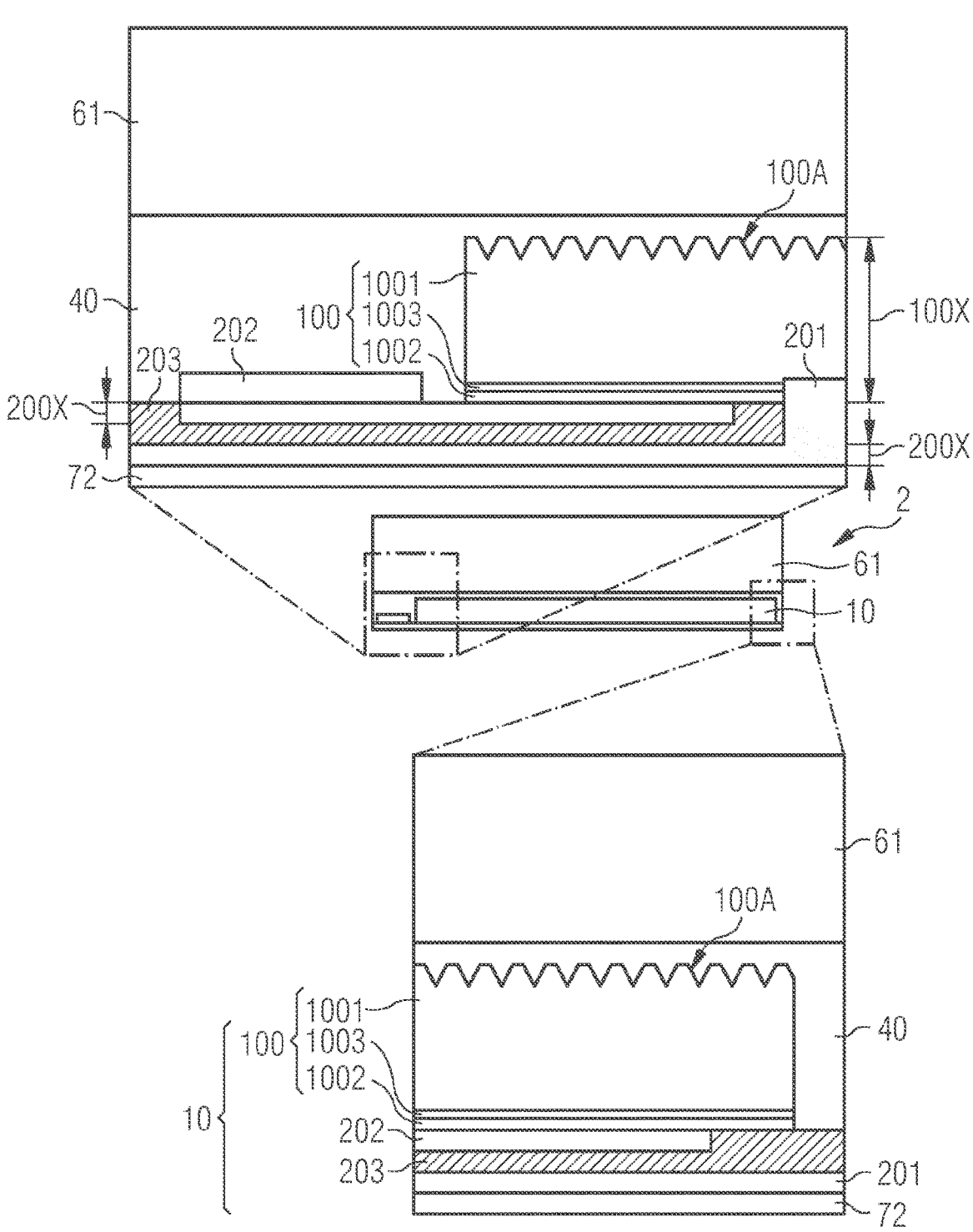
FIG. 7 shows a schematic sectional view of an auxiliary carrier-chip unit described here according to a first exemplary embodiment.

In the exemplary embodiment of an auxiliary carrier-chip unit 2 described here, shown in a sectional view in FIG. 7, the auxiliary carrier-chip unit 2 comprises an auxiliary carrier part 61 and a semiconductor chip 10. The semiconductor chip 10 is divided into a plurality of semiconductor layers which are combined in a semiconductor body 100. The semiconductor body 100 consists of a first semiconductor region 1001, a second semiconductor region 1002, and an active region 1003 arranged between the first semiconductor region 1001 and the second semiconductor region 1002. The active region 1003 comprises a pn-junction and is designed for the emission and/or detection of electromagnetic radiation. In particular, there is no growth substrate and/or no carrier body arranged between the semiconductor body 100 and the connector structures 201, 202.

The semiconductor body 100 is mechanically connected to the auxiliary carrier part 61 by means of a connecting layer 40. On the side of the semiconductor body 100 facing away from the auxiliary carrier part 61, a first connector structure 201, a second connector structure 202 and a dielectric layer 203 are located. The dielectric layer 203 is formed from an electrically insulating material and insulates the first connector structure 201 from the second connector structure 202. For example, the dielectric layer 203 is formed of silicon dioxide. The first connector structure 201 and the second connector structure 202 each have a thickness 200X. The thickness 200X of the connector structures 201, 202 is preferably more than 1 μm. This means that the mechanical stability of the connector structures 201, 202 is advantageously increased. The semiconductor body 100, together with the connector structures 201, 202 and the dielectric layer 203, forms a semiconductor chip 10.

The semiconductor body 100 also has a decoupling surface 100A on the side facing away from the connector structures 201, 202. The decoupling surface 100A is roughened and is designed for decoupling at least a major part of the electromagnetic radiation generated in the active region 1003. The semiconductor body 100 has a thickness 100X. The thickness 100X of the semiconductor body 100 corresponds to its extension perpendicular to its main extension direction. Preferably, the thickness 100X of the semiconductor body 100 is less than 10 μm. A particularly small distance from the active region 1003 to the connector structures 201, 202, which act as heat sinks, can thus be advantageously realized. Furthermore, it is particularly advantageous to design the dielectric layer 203 particularly thin in order to enable a good heat dissipation from the second connector structure 202 and thus achieve a particularly good cooling of the semiconductor body 10.

A second contact layer 72 is arranged on the side of the semiconductor region 100 facing away from the auxiliary carrier part 61. The second contact layer 72 is formed with a eutectic alloy of gold and tin and is used in particular to attach the auxiliary carrier-chip unit 2 to a connector carrier 30. The second contact layer 72 is already included in the semiconductor chip 10 in other figures and embodiments, but in the interests of better presentation is not shown in every figure.

The invention is not limited by the description based on the exemplary embodiments. Rather, the invention comprises each new feature, as well as any combination of features, which includes in particular every combination of features in the patent claims, even if this feature or this combination itself is not explicitly specified in the patent claims or exemplary embodiments.

The invention claimed is:

1. A method for producing an optoelectronic semiconductor component, the method comprising:

arranging a plurality of semiconductor chips on a carrier;

arranging an auxiliary carrier on sides of the semiconductor chips facing away from the carrier, the auxiliary carrier comprising a connecting layer;

melting the connecting layer so that the connecting layer penetrates into spaces between the semiconductor chips;

removing the carrier;

separating the auxiliary carrier between the semiconductor chips to form auxiliary carrier-chip units, each of the auxiliary carrier-chip units having at least one semiconductor chip and an auxiliary carrier part adjoining the semiconductor chip;

arranging each of the auxiliary carrier-chip units on a connecting carrier; and removing the auxiliary carrier part from each auxiliary carrier-chip unit.

2. The method as claimed in claim 1, further comprising fitting the semiconductor chips with electrical connector structures before arranging the plurality of semiconductor chips on the carrier.

3. The method as claimed in claim 1, wherein arranging the plurality of semiconductor chips on the carrier comprises arranging the plurality of semiconductor chips on the carrier by a first contact layer.

4. The method as claimed in claim 1, wherein the connecting layer comprises a thermoplastic connecting layer.

5. The method as claimed in claim 1, wherein arranging the auxiliary carrier comprises arranging the auxiliary carrier under a vacuum atmosphere.

6. The method as claimed in claim 1, wherein separating the auxiliary carrier comprises sawing the auxiliary carrier, or sawing or scoring and breaking the auxiliary carrier.

7. The method as claimed in claim 1, wherein the auxiliary carrier-chip units are arranged on the connecting carrier by a second contact layer.

8. The method as claimed in claim 7, wherein a surface tension of the second contact layer is greater than a surface tension of a material of the connecting layer.

9. The method as claimed in claim 7, wherein an arrangement of the auxiliary carrier-chip units on the connecting carrier takes place at temperatures between 200° C. and 300° C., inclusive.

10. The method as claimed in claim 1, wherein removing the auxiliary carrier part comprises a laser lift-off, etching, lifting or shearing.

11. The method as claimed in claim 1, further comprising removing residues of the connecting layer by a solvent or by plasma cleaning.

12. A method for producing an optoelectronic semiconductor component, the method comprising:

arranging a plurality of semiconductor chips with first main faces on a carrier, each semiconductor chip having a first main face, a second main face and side faces connecting the first main face with the second main face;

arranging an auxiliary carrier on second main faces of the semiconductor chips facing away from the carrier, the auxiliary carrier comprising a connecting layer;

melting the connecting layer so that the connecting layer completely covers the side faces of the semiconductor chips;

removing the carrier;

separating the auxiliary carrier between the semiconductor chips to form auxiliary carrier-chip units, each of the auxiliary carrier-chip units having at least one semiconductor chip and an auxiliary carrier part adjoining the semiconductor chip;

arranging each of the auxiliary carrier-chip units on a connecting carrier; and removing the auxiliary carrier part from each auxiliary carrier-chip unit.

13. The method as claimed in claim 12, further comprising fitting the semiconductor chips with electrical connector structures before arranging the plurality of semiconductor chips on the carrier.

14. The method as claimed in claim 12, wherein the connecting layer comprises a thermoplastic connecting layer.

15. The method as claimed in claim 12, wherein separating the auxiliary carrier comprises sawing the auxiliary carrier, or sawing or scoring and breaking the auxiliary carrier.

16. The method as claimed in claim 12, wherein the auxiliary carrier-chip units are arranged on the connecting carrier by a second contact layer.

17. The method as claimed in claim 16, wherein a surface tension of the second contact layer is greater than a surface tension of a material of the connecting layer.

18. An optoelectronic semiconductor component comprising:

a connector carrier; and a carrier-less semiconductor chip comprising:

a first connector structure;

a second connector structure;

a dielectric layer; and a semiconductor body comprising a first semiconductor region of a first conductor type, a second semiconductor region of a second conductor type, and an active region between the first semiconductor region and the second semiconductor region, the active region being configured to emit and/or detect electromagnetic radiation, wherein the first connector structure is electrically conductively connected to the first semiconductor region, wherein the second connector structure is electrically conductively connected to the second semiconductor region, wherein the dielectric layer separates the first and second connector structure, is directly connected to the first and second connector structures and isolates the first connector structure from the second connector structure, and wherein at least one of the connector structures is in direct contact via a contact layer with the connector carrier over an entire cross-sectional area of the semiconductor body, which is parallel to a main extension direction of the semiconductor body.

19. The optoelectronic semiconductor component as claimed in claim 18, further comprising an optical element arranged on the semiconductor chip on a side facing away from the connector carrier, wherein the optical element is transparent to the electromagnetic radiation, and wherein the optical element comprises a wavelength conversion material.

20. The optoelectronic semiconductor component as claimed in claim 18, wherein the at least one of the connector structures is in direct contact via the contact layer with the connector carrier over an area, which is larger than the entire cross-sectional area of the semiconductor body.

* * * * *